United States Patent
Bryant et al.

(10) Patent No.: US 6,943,405 B2
(45) Date of Patent: Sep. 13, 2005

(54) INTEGRATED CIRCUIT HAVING PAIRS OF PARALLEL COMPLEMENTARY FINFETS

(75) Inventors: Andres Bryant, Essex Junction, VT (US); William F. Clark, Jr., Essex Junction, VT (US); David M. Fried, Ithaca, NY (US); Mark D. Jaffe, Shelburne, VT (US); Edward J. Nowak, Essex Junction, VT (US); John J. Pekarik, Underhill, VT (US); Christopher S. Putnam, Hinesburg, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/604,206

(22) Filed: Jul. 1, 2003

(65) Prior Publication Data

US 2005/0001273 A1 Jan. 6, 2005

(51) Int. Cl.[7] .......................... H01L 21/00; H01L 29/76
(52) U.S. Cl. ..................... 257/327; 257/329; 257/330; 257/347; 257/350; 257/369; 438/154; 438/157; 438/164
(58) Field of Search ................................. 257/9, 14, 24, 257/27, 327, 329, 330, 350–351, 347, 369; 438/157, 283, 286, 294, 154, 164

(56) References Cited

U.S. PATENT DOCUMENTS 5,218,232 A * 6/1993 Yuzurihara et al. ......... 257/754
6,252,284 B1    6/2001 Muller et al.
6,413,802 B1    7/2002 Hu et al.
6,762,448 B1 *  7/2004 Lin et al. ..................... 257/302
6,770,516 B2 *  8/2004 Wu et al. ..................... 438/154
6,800,910 B2 * 10/2004 Lin et al. ..................... 257/410

* cited by examiner

Primary Examiner—Donghee Kang
(74) Attorney, Agent, or Firm—McGinn & Gibb, PLLC; William D. Sabo, Esq.

(57) ABSTRACT

A method and structure for an integrated circuit structure that utilizes complementary fin-type field effect transistors (FinFETs) is disclosed. The invention has a first-type of FinFET which includes a first fin, and a second-type of FinFET which includes a second fin running parallel to the first fin. The invention also has an insulator fin positioned between the source/drain regions of the first first-type of FinFET and the second-type of FinFET. The insulator fin has approximately the same width dimensions as the first fin and the second fin, such that the spacing between the first-type of FinFET and the second-type of FinFET is approximately equal to the width of one fin. The invention also has a common gate formed over channel regions of the first-type of FinFET and the second-type of FinFET. The gate includes a first impurity doping region adjacent the first-type of FinFET and a second impurity doping region adjacent the second-type of FinFET. The differences between the first impurity doping region and the second impurity doping region provide the gate with different work functions related to differences between the first-type of FinFET and the second-type of FinFET. The first fin and the second fin have approximately the same width.

18 Claims, 11 Drawing Sheets

INTEGRATED CIRCUIT HAVING PAIRS OF PARALLEL COMPLEMENTARY FINFETS

BACKGROUND OF INVENTION

1. Field of the Invention

The present invention generally relates to transistors and more particularly to the fin type transistors known as Fin-FETs and to forming two or more FinFETs in the space of a single conventional FinFET.

2. Description of the Related Art

As the need to decrease the size of transistors continues, new and smaller types of transistors are created. One recent advance in transistor technology is the introduction of fin type field effect transistors that are known as FinFETs. U.S. Pat. No. 6,413,802 to Hu et al. (hereinafter "Hu"), which is incorporated herein by reference, discloses a FinFET structure that includes a center fin that has a channel along its center and source and drains at the ends of the fin structure. A gate conductor covers the channel portion.

While FinFETs structures reduce the size of transistor based devices, it is still important to continue to reduce the size of FinFETs transistors. The invention described below provides a method/structure which allows two or more FinFETs to be formed in the place where previously only one FinFET could be previously formed, thereby approximately doubling the density of the FinFETs.

SUMMARY OF INVENTION

The invention provides an integrated circuit structure that utilizes complementary fin-type field effect transistors (FinFETs). The invention has a first-type of FinFET which includes a first fin, and a second-type of FinFET which includes a second fin running parallel to the first fin. The invention also has an insulator fin positioned between the source/drain regions of the first first-type of FinFET and the second-type of FinFET. The insulator fin has approximately the same width dimensions as the first fin and the second fin, such that the spacing between the first-type of FinFET and the second-type of FinFET is approximately equal to the width of one fin. The invention also has a common gate formed over channel regions of the first-type of FinFET and the second-type of FinFET. The gate includes a first impurity doping region adjacent the first-type of FinFET and a second impurity doping region adjacent the second-type of FinFET. The differences between the first impurity doping region and the second impurity doping region provide the gate with different work functions related to differences between the first-type of FinFET and the second-type of FinFET. The first fin and the second fin have approximately the same width.

The invention also provides a method of forming pairs of complementary parallel fin-type field effect transistors (FinFETs). The method forms a semiconductor layer on a substrate. Next, the method forms a mandrel structure that has substantially vertical sidewalls on the semiconductor layer. The method forms a series of three layers of spacers on the sidewalls of the mandrel structure. The method removes the mandrel structure and the middle spacer of the spacers, such that an inner spacer and an outer spacer remain extending from the semiconductor layer. The method then patterns the semiconductor layer, using the inner spacer and the outer spacer as masks such that regions protected by the inner spacer and the outer spacer remain as a first fin and a second fin extending from the substrate. The method dopes channel regions in the first fin and the second fin differently from one another using angled implantations.

The method also forms a gate conductor over a central region of the first fin and the second fin. The method dopes portions of the first fin and the second fin not protected by the gate conductor to form source and drain regions in the first fin and the second fin. The method then insulates the source/drain regions of the first fin from source/drain regions of the second fin.

The doping of the channel regions includes doping the first fin with a first channel doping species from an angle that is substantially perpendicular to the first fin such that the first fin protects the second fin from receiving the first channel doping species. The process forms the semiconductor layer which provides a second channel doping species within the semiconductor layer. The doping of the channel regions also dopes the second fin with a second channel doping species from an angle that is substantially perpendicular to the second fin such that the second fin protects the first fin from receiving the second channel doping species.

The method also includes a process that forms the series of three layers of spacers. The method forms the inner spacer along a sidewall of the mandrel structure. The method also forms the middle spacer on the inner spacer and the outer spacer on the middle spacer. The process of doping the source and drain regions implants different dopants at different angles into source and drain regions of the first fin and the second fin.

The mandrel structure includes two parallel sidewalls and simultaneously forms pairs of spacer structures adjacent each of the sidewalls. The mandrel structure and the middle spacer comprise similar material, such that the removing process removes the mandrel and the middle spacer in a single process. The process of insulating the source and drain regions deposits dielectric materials over the first fin and the second fin and then removes the dielectric material from all areas except between the source and drain regions of the first fin and the second fin.

The invention also provides a method of forming parallel fin structures on a substrate that forms a mandrel structure that has substantially vertical sidewalls on the semiconductor layer. The method forms a series of three layers of spacers on the sidewalls of the mandrel structure, and then removes the mandrel structure and the middle spacer of the spacers, such that an inner spacer and an outer spacer remain extending from the substrate. The inner spacer and the outer spacer can include conductors, semiconductors; and mask elements, that are used to pattern features into the substrate.

The method also includes a process that forms a series of three layers of spacers. The method forms the inner spacer along a sidewall of the mandrel structure. The method also forms the middle spacer on the inner spacer, and the outer spacer on the middle spacer. The spacers all have approximately the same width, such that the inner spacer is separated from the outer spacer by the width of one spacer.

The invention also provides a method of forming parallel structures on a substrate. The method forms a layer of material on the substrate. The method then forms a mandrel structure that has substantially vertical sidewalls on the layer of material. The method forms a series of three or more layers of spacers on the sidewalls of the mandrel structure. The method then removes the mandrel structure and alternate layers of the spacers, such that evenly separated spacer layers remain extending from the underlying material. The method patterns the layer of material using the inner spacer and the outer spacer as masks, such that regions protected by the evenly separated spacer layers remain as multiple fins extending from the substrate.

BRIEF DESCRIPTION OF DRAWINGS

The invention will be better understood from the following detailed description of preferred embodiments of the invention with reference to the drawings, in which.

DETAILED DESCRIPTION

Figure 1:
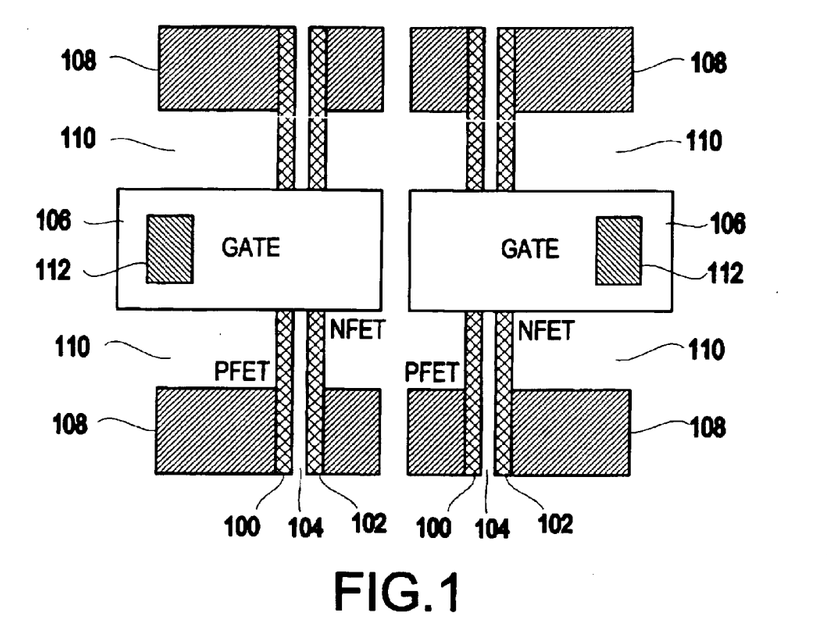
FIG. 1 is a schematic diagram of a dual-density structure according to the invention.

As mentioned above, the invention allows two or more FinFETs to be formed in the space where previously only one FinFET could be formed, thereby approximately doubling (quadrupling, etc.) the density of the FinFETs. The structure utilized by the invention is shown in FIG. 1 which shows a top view. FIG. 1 illustrates four fins 100, 102 that define four separate transistors. More specifically, the fins 100 form P-type field effect transistors (PFETs) and the fins 102 form N-type field effect transistors (NFETs). An insulator 104 separates the two fins. The gates which surround the channel regions of the fins are shown as items 106. The gate contacts are shown as items 112, while the contacts for the source and drain of the various transistors shown are labeled item 108. Item 110 represents an insulator region that can comprise the isolation region that separates the various transistors. While FIG. 1 illustrates complementary N-type and P-type transistors, one ordinarily skilled in the art would understand after reading this disclosure that the structure is not limited to complementary type transistors and could comprise any form of transistor based structure. While the description focuses on an exemplar two-FinFET structure, one ordinarily skilled in the art would understand after reading this disclosure that the structure is not limited to pairs and multiple FinFETs could be formed.

Figure 2:
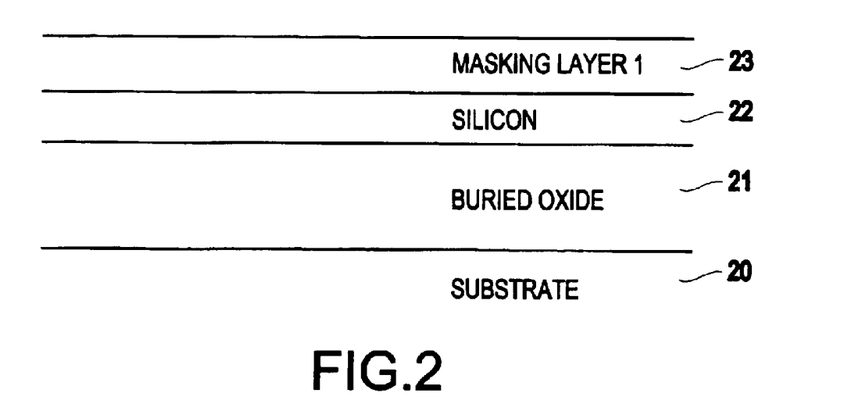
FIG. 2 is a schematic diagram of a partially completed dual-density FinFET structure according to the invention.

FIGS. 2–23 illustrate various stages of processing when manufacturing the device. FIG. 2 illustrates a cross-sectional diagram of a laminated structure that includes a substrate 20, oxide layer 21, silicon layer 22, and a masking layer 23 (such as an oxide or other masking material). The substrate 20, oxide layer, 21, and silicon layer 22 comprise a silicon-over-insulator (SOI) structure that isolates the silicon 22 from the underlying substrate 20 which improves the transistors performance dramatically.

Figure 3:
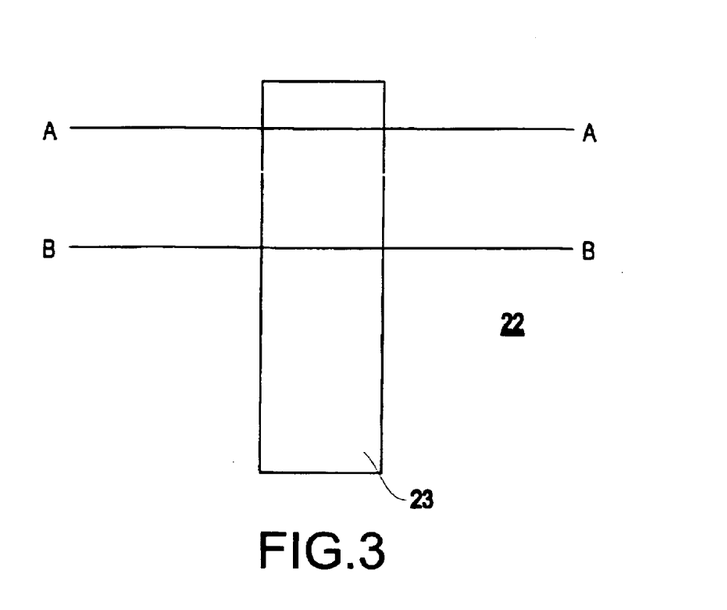
FIG. 3 is a schematic diagram of a partially completed dual-density FinFET structure according to the invention.
Figure 4:
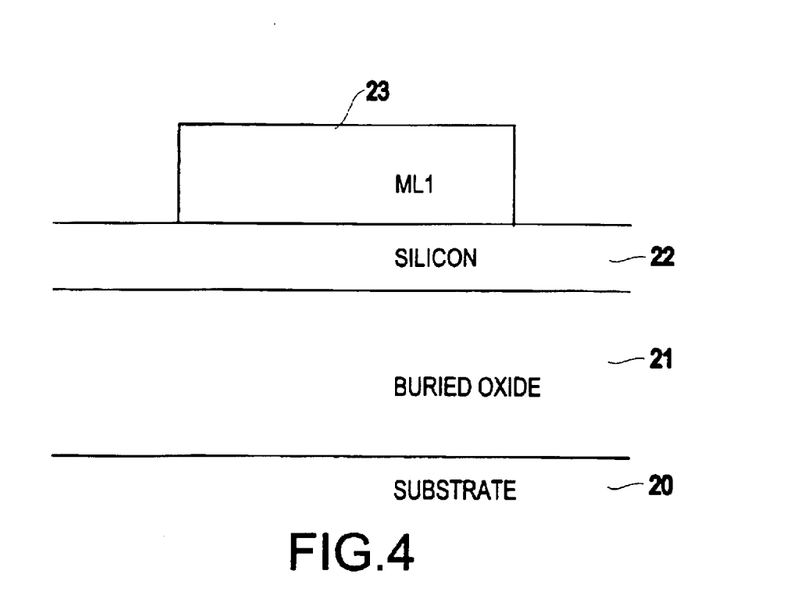
FIG. 4 is a schematic diagram of a partially completed dual-density FinFET structure according to the invention.
Figure 5:
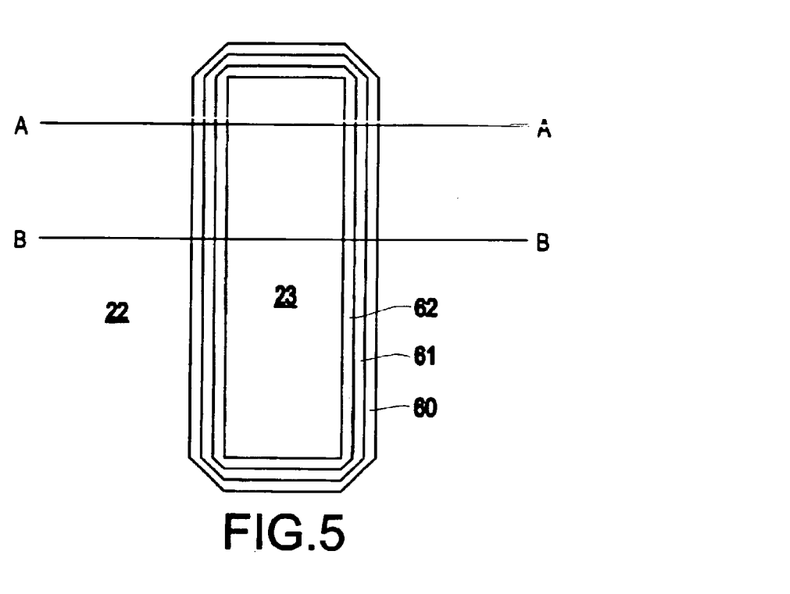
FIG. 5 is a schematic diagram of a partially completed dual-density FinFET structure according to the invention.
Figure 6:
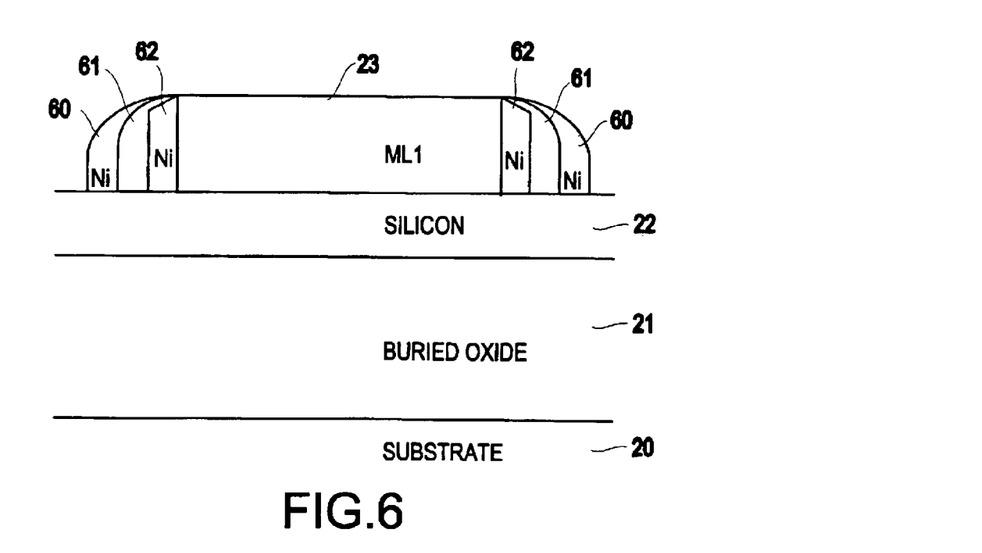
FIG. 6 is a schematic diagram of a partially completed dual-density FinFET structure according to the invention.

The masking layer 23 is patterned to form a polygon structure 23 (stripe, mesa, mandrel, rectangular box, etc.) 23 as shown in top-view in FIG. 3 and cross-sectional view in FIG. 4. Then, as shown in top and cross-sectional views in FIGS. 5 and 6, a series of sidewall spacers 60–62 are formed around the mesa 23. The sidewall spacers 60–62 are formed by depositing a material and then performing a selective anisotropic etching process that removes material from horizontal surfaces at substantially higher rates than it removes material from vertical surfaces. This process leaves the deposited material only along the sidewalls of the existing structures. This process of forming sidewall spacers is repeated to form the three different sidewall spacers 60–62 shown in FIGS. 5 and 6. The inner and outer sidewall spacers 60, 62 are formed of a hard material (such $Si_3N_4$ or other hard masking material) while the middle spacer 61 is formed of a sacrificial material such as an oxide or other material so that it can be selectively etched with respect to the inner and outer spacers 60, 62.

One advantage of using spacer technology is that spacers can have sizes that are smaller than the minimum-sized lithographic feature that can be formed using state of the art lithographic techniques. For example, if the width of the mesa 23 has the smallest width possible, as limited by the then current state of art lithographic techniques, the spacers formed on the sides of the mesa 23 will be sub-lithographic in size (smaller than the smallest possible lithographic size). In addition, the spacers are self aligned with the mesa structure 23 and each other, which eliminates the need to align the spacers.

Figure 7:
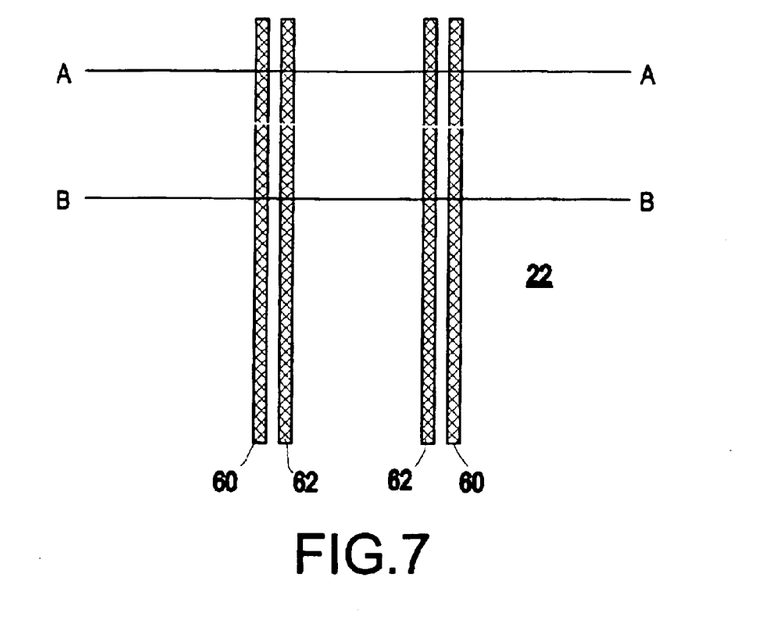
FIG. 7 is a schematic diagram of a partially completed dual-density FinFET structure according to the invention.
Figure 8:
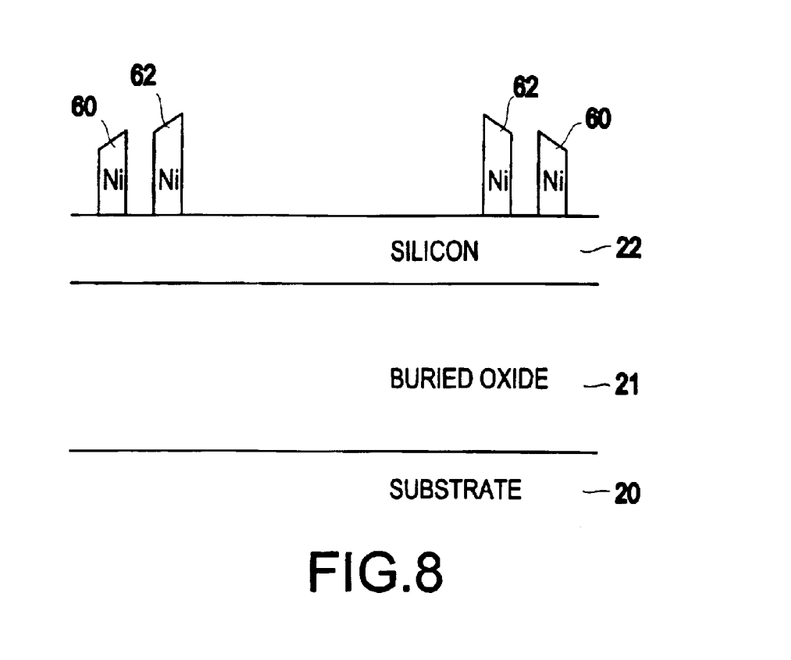
FIG. 8 is a schematic diagram of a partially completed dual-density FinFET structure according to the invention.

Next, as shown in the top and cross-sectional views in FIGS. 7 and 8, the sacrificial spacer 61 and the mandrel 23 are removed using a selective etching process that removes the mesa 23 and spacer 61, yet does not substantially affect the harder structures such as the silicon 22, and the inner and outer spacers 60, 62. While some specific materials are mentioned in this disclosure, virtually any materials could be used for the structures described herein so long as the mesa 23 and the middle spacer 61 can be selectively removed with respect to the inner and outer spacers 60, 62. Preferably, the middle spacer 61 and the mesa 23 are formed of the same (or very similar material), which would permit simultaneous removal of both structures.

Figure 9:
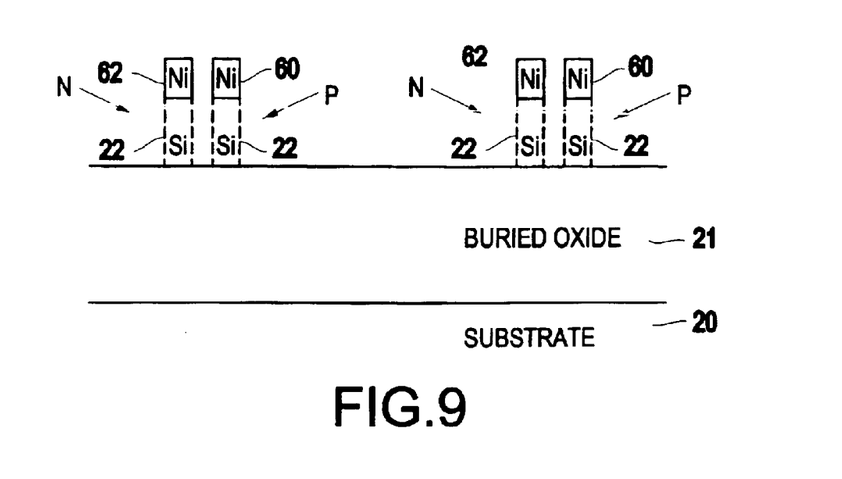
FIG. 9 is a schematic diagram of a partially completed dual-density FinFET structure according to the invention.

In FIG. 9, the silicon 22 is patterned in an etching process using the spacers 60, 62 as masks. In addition, before or after this step, the spacers can be planarized to remove any rounding on the upper surfaces. While the following description utilizes the patterned structures to form FinFETs, one ordinarily skilled in the art would understand (in light of this disclosure) that the structures themselves could be used as conductors, semiconductors, insulators, structural supports, masks, etc. Therefore, while the following description centers on transistors, the invention is not limited thereto. FIG. 9 also illustrates an ion implantation process that dopes the channel regions of the fins. In this example, the ion implantation is N-type and P-type. However, many other types of transistors could be formed, dependent upon the specific design requirements, and the invention is not limited to the specific types of transistors used in these exemplary embodiments. Further, in this example, the ion implantations are angled so that the silicon portions below spacers 60 only receive the first type of implant (P-type) while the silicon portions below spacers 62 only receive the second type of implant (N-type). By using an angled implantation process, the spacer and fin that is closer to the perpendicular direction from which the implant is directed shields the adjacent fin that is further from the perpendicular direction from which the implant is directed.

Figure 10:
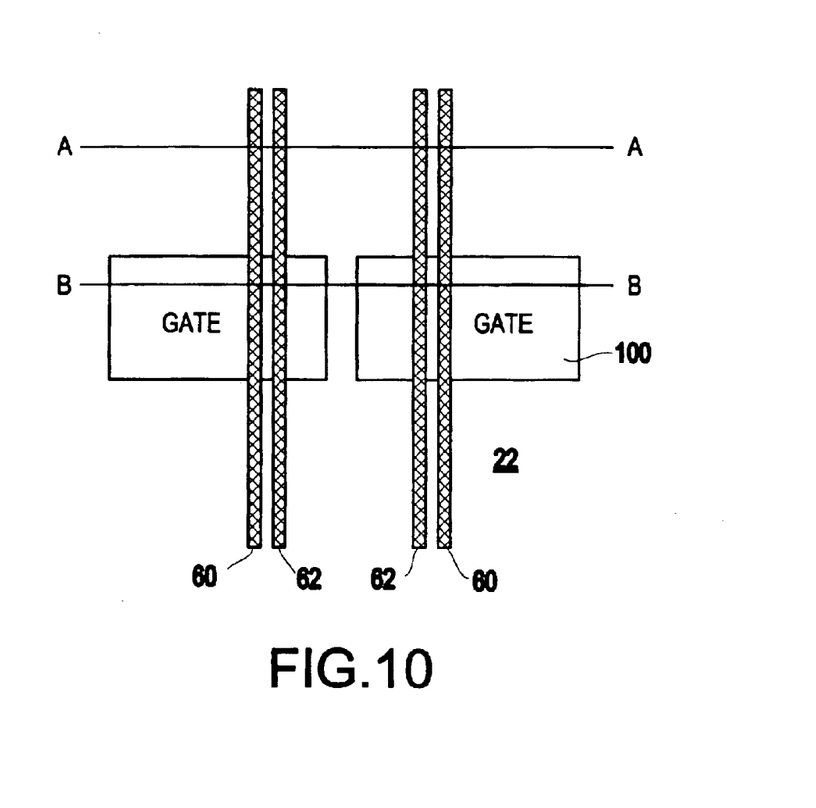
FIG. 10 is a schematic diagram of a partially completed dual-density FinFET structure according to the invention.
Figure 11:
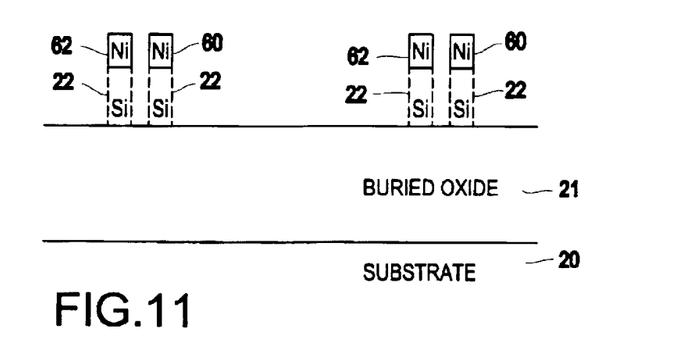
FIG. 11 is a schematic diagram of a partially completed dual-density FinFET structure according to the invention.
Figure 12:
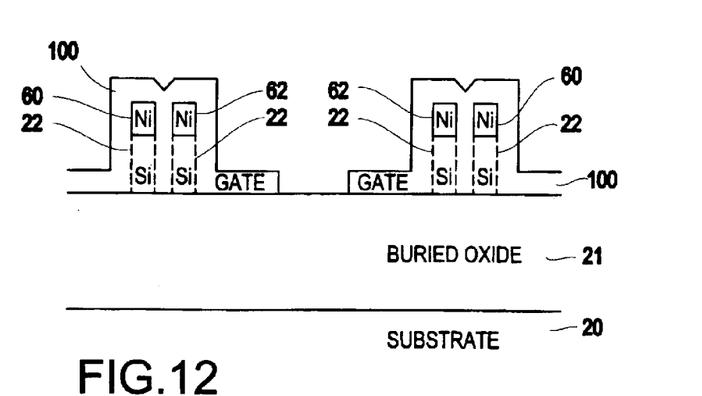
FIG. 12 is a schematic diagram of a partially completed dual-density FinFET structure according to the invention.
Figure 13:
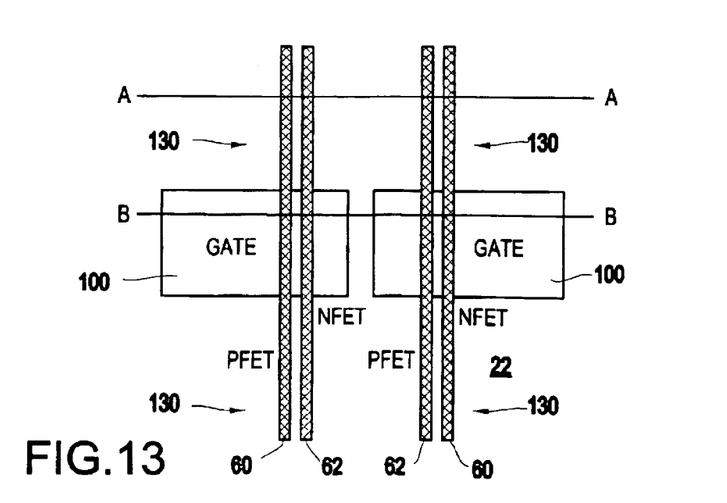
FIG. 13 is a schematic diagram of a partially completed dual-density FinFET structure according to the invention.

Next, a gate 100 is patterned over each of the pairs of fins, as shown in FIG. 10. As is common with FinFET technology, the gate 100 surrounds both sides and the top of the fin along the center portion of the fin (the channel region of the fin). The region shown by line A—A in FIG. 10 is shown in cross-sectional view in FIG. 11 and the region shown by line B—B in FIG. 10 is shown cross-sectional view in FIG. 12. In order to provide different work functions for the portion of the gate which is above the N-type doped silicon verses the P-type doped silicon, the gate can undergo different types of angled implants (from different angles that are all perpendicular to the longitudinal direction of the parallel fins) as was done to dope the channel regions 22, above. Alternatively, the gate material itself can be pre-doped (include some level of impurity prior to being deposited) and then an additional angled doping implant can be performed on one side of the gate conductor to perform a different implantation into one side of the gate structure 100 to change the work function of that side of the gate conductor. Once again, by performing an angled implant(s), the side of the gate conductor that is away from the direction from which the angled implant is directed will be shielded from the implant, thereby allowing different portions of the gate conductors to receive different work function implants. After this, the source and drain regions of the fins (the regions not covered by the gate conductors) 130 receive the source and drain dopants as shown in FIG. 13. If different dopants are used for the source and drain, the individual fins can be doped selectively, again using angled implants of different impurities from different perpendicular angles as discussed above.

Figure 14:
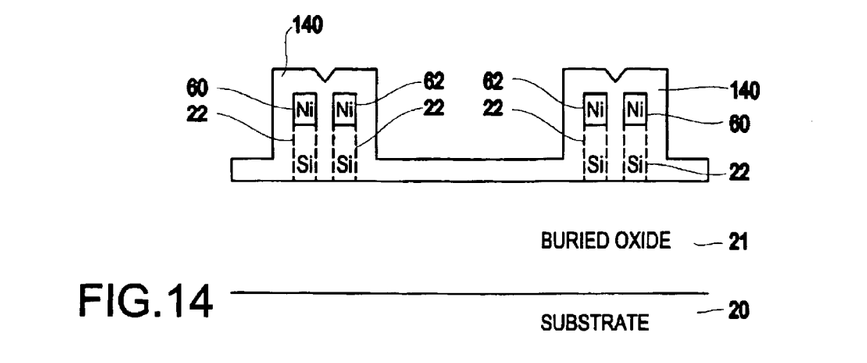
FIG. 14 is a schematic diagram of a partially completed dual-density FinFET structure according to the invention.
Figure 15:
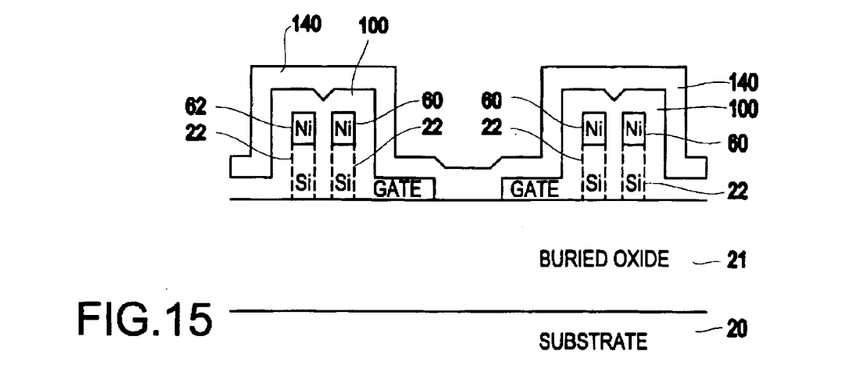
FIG. 15 is a schematic diagram of a partially completed dual-density FinFET structure according to the invention.
Figure 16:
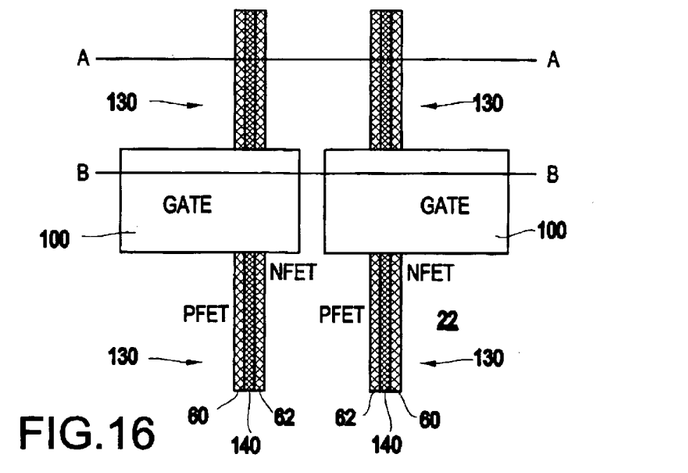
FIG. 16 is a schematic diagram of a partially completed dual-density FinFET structure according to the invention.
Figure 17:
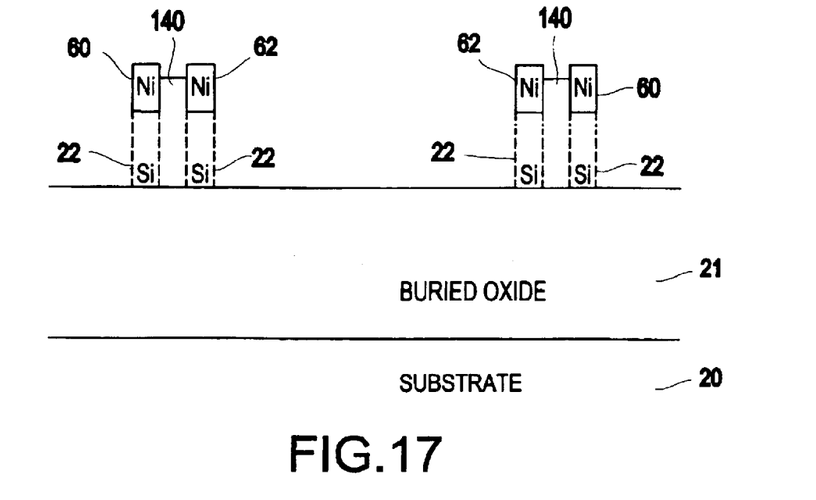
FIG. 17 is a schematic diagram of a partially completed dual-density FinFET structure according to the invention.

FIGS. 14 and 15 illustrate a conformal dielectric layer 140 (such as a nitride, etc.) deposited over the entire structure. FIG. 14 is a cross-sectional view along line A—A while FIG. 15 is a cross-sectional view along line B—B. FIGS. 16 and 17 illustrate that the dielectric 140 is next removed in, for example, a selective etching process from all areas except between the source and drain regions 130 of the fins. Indeed, as shown in FIG. 17, the dielectric 140 is even recessed below the top of the fin. FIG. 17 is a cross-sectional view along line A—A of the top view shown in FIG. 16. The view along line B—B would appear the same as shown and FIG. 12 because, as stated above, the dielectric 140 only remains between the source/drain regions 130.

Figure 18:
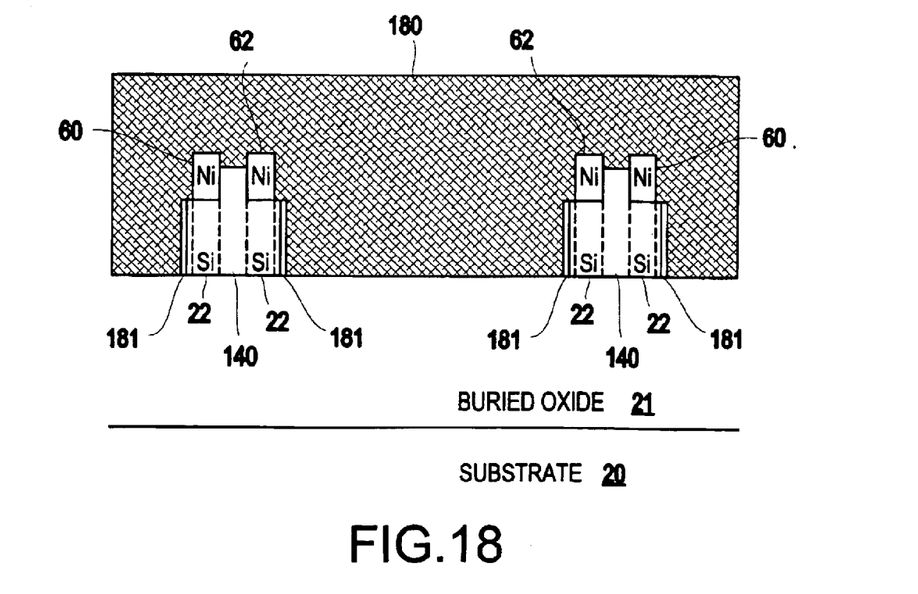
FIG. 18 is a schematic diagram of a partially completed dual-density FinFET structure according to the invention.
Figure 19:
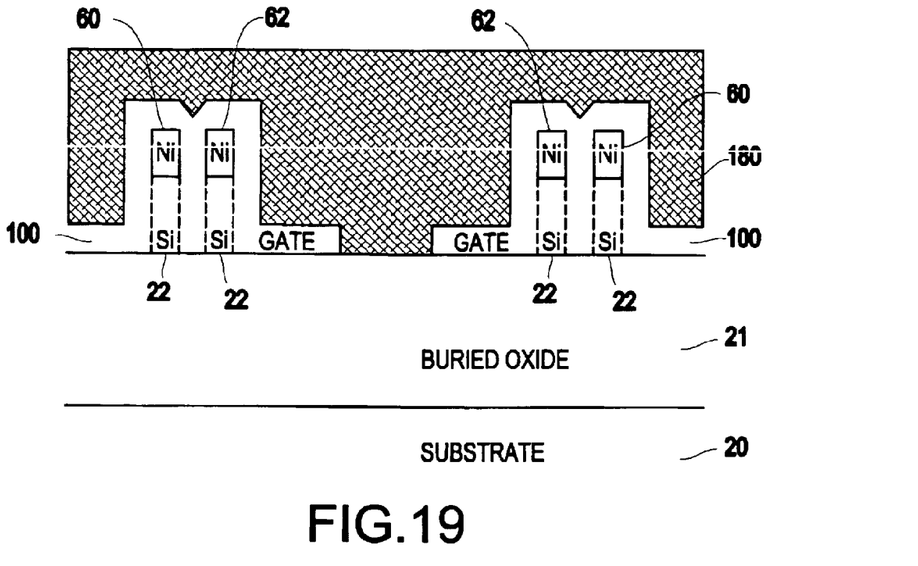
FIG. 19 is a schematic diagram of a partially completed dual-density FinFET structure according to the invention.
Figure 20:
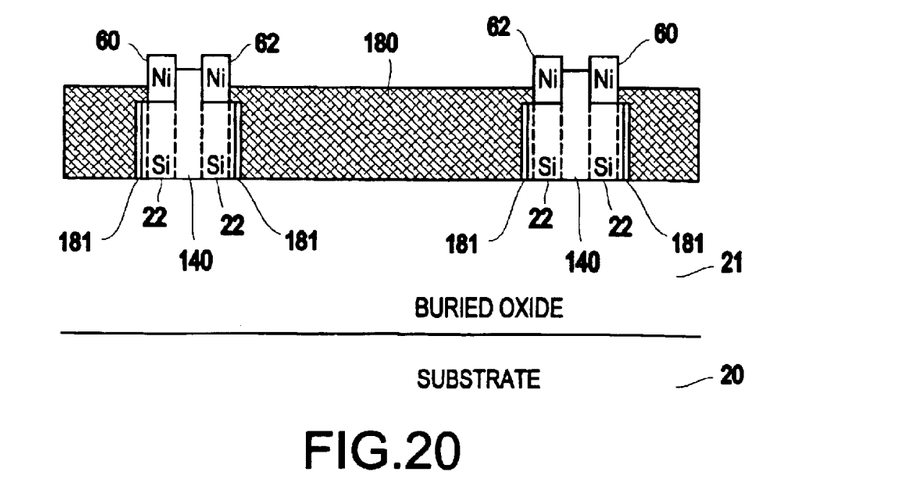
FIG. 20 is a schematic diagram of a partially completed dual-density FinFET structure according to the invention.
Figure 21:
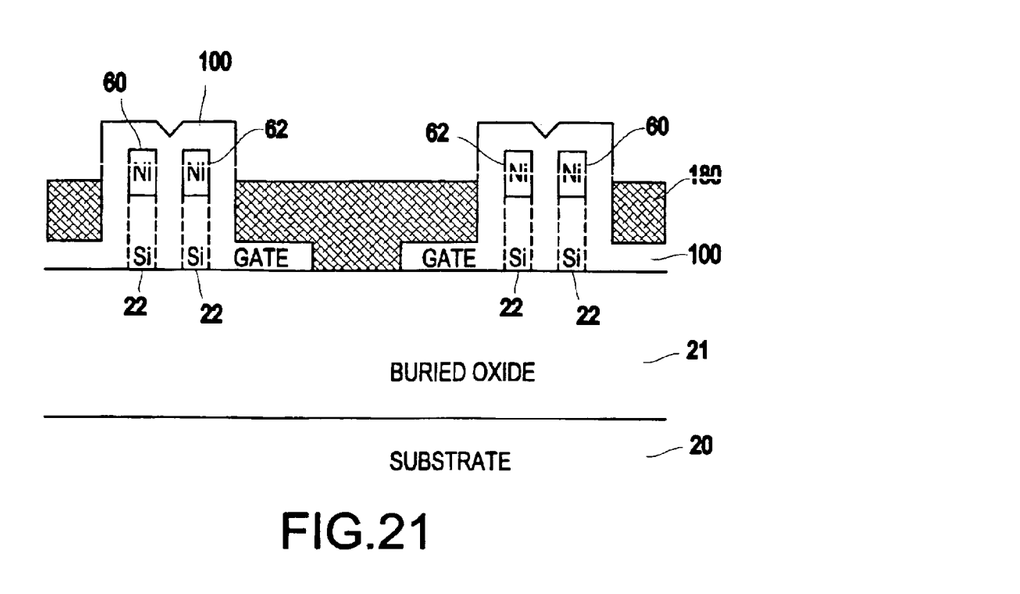
FIG. 21 is a schematic diagram of a partially completed dual-density FinFET structure according to the invention.

As shown in FIG. 18, which is a cross-sectional view of the source/drain regions along line A—A, the exposed silicon areas 22 are silicided forming silicide regions 181. Next, a conductor such as tungsten 180 is deposited over the entire structure. FIG. 19 illustrates the tungsten 180 overlying the channel region and gates of the fins that appears along line B—B. In FIGS. 20 and 21, the tungsten is recessed below the top of the fins. FIG. 20 is a cross-sectional view of the source/drain regions along line A—A and FIG. 21 is a cross-sectional view of the gate/channel region along line B—B.

Figure 22:
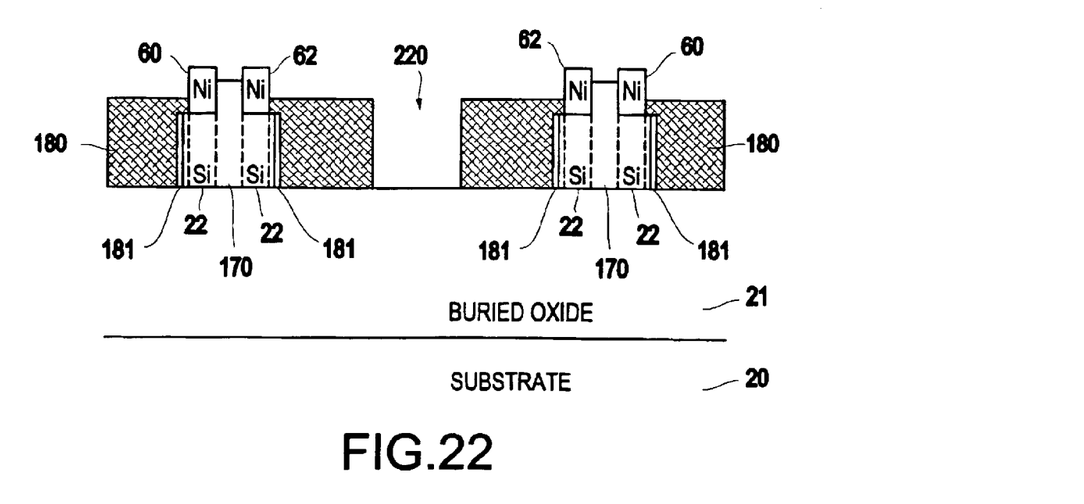
FIG. 22 is a schematic diagram of a partially completed dual-density FinFET structure according to the invention.
Figure 23:
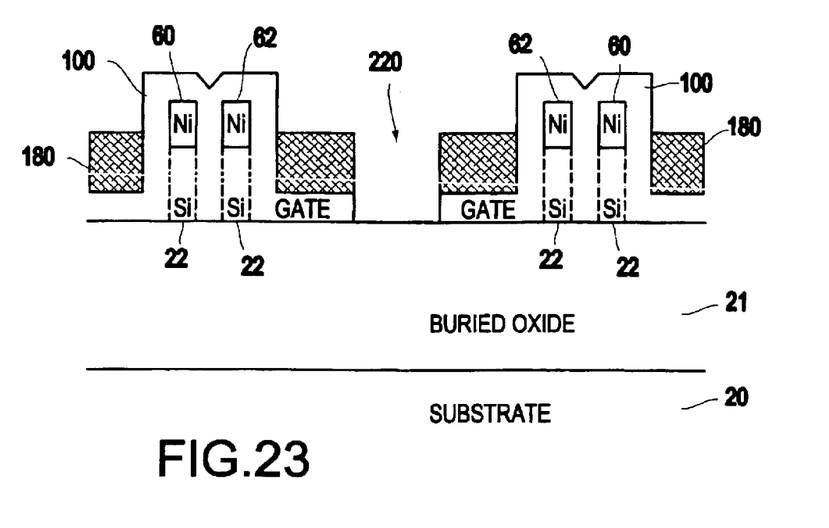
FIG. 23 is a schematic diagram of a partially completed dual-density FinFET structure according to the invention.

FIG. 22 illustrates a cross-section sectional view of the source/drain regions along line A—A and shows the additional processing where the tungsten 180 is patterned to remove the tungsten from a region 220 between the sets of fins. FIG. 23 illustrates the same patterning 220 of the tungsten 180 in the channel/gate region along line B—B. FIG. 1 illustrates the additional patterning of the tungsten 180 into the various contacts 108, 112, etc., that are described above. In addition, the structure shown FIG. 1 has additional dielectrics deposited in order to isolate the different structures. Various planarization processes can be performed, as are well known to those ordinarily skilled in the art, to complete the structure.

Figure 24:
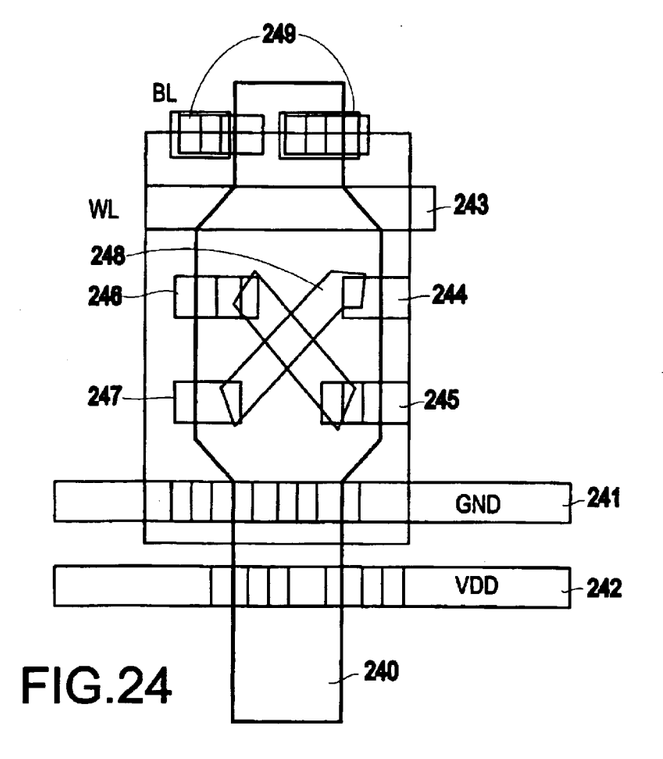
FIG. 24 is a schematic diagram of a cross-coupled FinFET structure according to the invention.

FIG. 24 is a schematic view of the inventive high-density SRAM cell structure that includes pairs of transistors 244–247 (where each box represents one pair of parallel complementary transistors) crossed coupled with wiring patterns 248. Item 241 represents the ground line and item 242 represents the voltage line. Item 249 represents the bitline contacts. Item 243 represents the word-line acting as gate of access transistors. While FIG. 24 shows one exemplary circuit using the inventive transistors, one ordinarily skilled in the art would understand (in light of this disclosure) that many additional and different FinFET based structures can be created with the invention.

As described above, the inventive process produces a structure that almost doubles the density of FinFET devices. The invention utilizes spacer technology to form the fins, which allows the fins of different transistors to be formed much closer together (only separated by one spacer width) and allows the fins to be sub-lithographic in size. The invention also provides for angled ion implants, which allows one fin to shield the other fin (in each set of fins) to permit the fins to be selectively doped differently. Therefore, the invention easily produces complementary transistors. The complementary transistors share a gate and can be contacted individually allowing the formation of integrated circuits in a smaller area. The invention also provides a method to form pairs of fins, that could be formed into transistors, or used as wires or resistors to contact each fin independently.

While the invention has been described in terms of preferred embodiments, those skilled in the art will recognize that the invention can be practiced with modification within the spirit and scope of the appended claims.

What is claimed is:

1. An integrated circuit structure utilizing fin-type field effect transistors (FinFETs) comprising:

a first FinFET having a first fin;

a second FinFET having a second fin running parallel to said first fin, wherein said first FinFET comprises a separate transistor from said second FinFET; and an insulator fin positioned between said first fin and said second fin, wherein said insulator fin has approximately the same width dimensions as said first fin and said second fin, such that the spacing between said first FinFET and said second FinFET is approximately equal to the width of one fin.

2. The integrated circuit structure in claim 1, further comprising a common gate formed over channel regions of said first FinFET and said second FinFET.

3. The integrated circuit structure in claim 1, wherein said first fin and said second fin have approximately the same width.

4. The integrated circuit structure in claim 1, further comprising source and drain contacts connected to ends of said first fin and said second fin, wherein source and drain contacts of said first FinFET are electrically separated from source and drain contacts of said second FinFET.

5. An integrated circuit structure utilizing fin-type field effect transistors (FinFETs) comprising:

a first FinFET having a first fin;

a second FinFET having a second fin running parallel to said first fin;

an insulator fin positioned between source/drain regions of said first FinFET and said second FinFET, wherein said insulator fin has approximately the same width dimensions as said first fin and said second fin, such that the spacing between said first FinFET and said second FinFET is approximately equal to the width of one fin; and a common gate formed over channel regions of said first FinFET and said second FinFET, wherein said common gate includes a first impurity doping region adjacent said first FinFET and a second impurity doping region adjacent said second FinFET.

6. The integrated circuit structure in claim 5, wherein differences between said first impurity doping region and said second impurity doping region provide said common gate with different work functions related to differences between said first FinFET and said second FinFET.

7. An integrated circuit structure utilizing complementary fin-type field effect transistors (FinFETs) comprising:

a first-type of FinFET having a first fin;

a second-type of FinFET having a second fin running parallel to said first fin, wherein said first FinFET comprises a separate transistor from said second FinFET;

an insulator fin positioned between said first fin and said second fin, wherein said insulator fin has approximately the same width dimensions as said first fin and said second fin, such that the spacing between said first-type FinFET and said second-type FinFET is approximately equal to the width of one fin, a common gate formed over channel regions of said first-type of FinFET and said second-type of FinFET.

8. The integrated circuit structure in claim 7, wherein said first fin and said second fin have approximately the same width.

9. The integrated circuit structure in claim 7, further comprising source and drain contacts connected to ends of said first fin and said second fin, wherein source and drain contacts of said first-type of FinFET are electrically separated from source and drain contacts of said second-type of FinFET.

10. The integrated circuit structure in claim 7, wherein said first-type of FinFET is complementary to said second-type of FinFET.

11. An integrated circuit structure utilizing complementary fin-type field effect transistors (FinFETs) comprising:

a first-type of FinFET having a first fin;

a second-type of FinFET having a second fin running parallel to said first fin;

an insulator fin positioned between source and drain regions of said first first-type of FinFET and said second-type of FinFET, wherein said insulator fin has approximately the same width dimensions as said first fin and said second fin, such that the spacing between said first-type of FinFET and said second-type of FinFET is approximately equal to the width of one fin; and a common gate formed over channel regions of said first-type of FinFET and said second-type of FinFET, wherein said common gate includes a first impurity doping region adjacent said first-type of FinFET and a second impurity doping region adjacent said second-type of FinFET.

12. The integrated circuit structure in claim 11, wherein differences between said first impurity doping region and said second impurity doping region provide said common gate with different work functions related to differences between said first-type of FinFET and said second-type of FinFET.

13. An integrated circuit structure utilizing fin-type field effect transistors (FinFETs) comprising:

a first FinFET having a first fin;

a second FinFET having a second fin running parallel to said first fin, wherein said first FinFET comprises a separate transistor from said second FinFET;

an insulator fin positioned between said first fin and said second fin, wherein said insulator fin has approximately the same width dimensions as said first fin and said second fin, such that the spacing between said first FinFET and said second FinFET is approximately equal to the width of one fin, and source and drain contacts connected to ends of said first fin and said second fin, wherein source and drain contacts of said first FinFET are electrically separated from source and drain contacts of said second FinFET.

14. The integrated circuit structure in claim 13, wherein said first fin and said second fin have approximately the same width.

15. The integrated circuit structure in claim 13, wherein said first FinFET comprises a complementary type of transistor with respect to said second FinFET.

16. The integrated circuit structure in claim 15, further comprising a common gate formed over channel regions of said first FinFET and said second FinFET.

17. The integrated circuit structure in claim 16, wherein said common gate includes a first impurity doping region adjacent said first FinFET and a second impurity doping region adjacent said second FinFET.

18. The integrated circuit structure in claim 17, wherein differences between said first impurity doping region and said second impurity doping region provide said common gate with different work functions related to differences between said first FinFET and said second FinFET.

* * * * *